United States Patent
Kermani

[19]

[11] Patent Number: 6,137,369
[45] Date of Patent: Oct. 24, 2000

[54] RING OSCILLATOR CLOCK GENERATOR NETWORK

[75] Inventor: Bahram Ghaffarzadeh Kermani, Whitehall, Pa.

[73] Assignee: Lucent Technologies Inc., Murray Hill, N.J.

[21] Appl. No.: 09/262,150

[22] Filed: Mar. 3, 1999

[51] Int. Cl.[7] .............................. H03B 5/02; H03B 27/00
[52] U.S. Cl. ................................ 331/45; 331/46; 331/57; 331/60
[58] Field of Search .................................. 331/45, 46, 50, 331/57, 60

[56] References Cited

U.S. PATENT DOCUMENTS 5,592,126  1/1997  Boudewijns et al. ..................... 331/57

Primary Examiner—Siegfried H. Grimm
Attorney, Agent, or Firm—Mark A. Kurisko

[57] ABSTRACT

A clock generator having a ring structure and a chain structure. The ring structure is formed of an even number of serially connected distributed oscillator elements, and the chain structure is formed of an even number of serially connected distributed oscillator elements. The chain structure is coupled across an odd number of oscillator elements in the ring structure. The ring structure and chain structure, when connected together, generate a clock signal that can be extracted from any of the distributed of oscillator elements.

15 Claims, 4 Drawing Sheets

RING OSCILLATOR CLOCK GENERATOR NETWORK

FIELD OF THE INVENTION

This invention relates to an apparatus for generating distributing a clock signal. Particularly, the invention concerns an apparatus for generating a clock signal with distributed oscillator elements.

BACKGROUND OF THE INVENTION

A clock source can output a clock signal that synchronizes the activities in a large synchronous system, such as a memory array. The clock signal acts as both a sequence reference and as a time reference for events within the synchronous system. As a sequence reference, the clock transitions define successive instants at which system state changes occur. As a time reference, the time period between clock transitions accounts for system delays occurring between the output of the clock source and the input to a selected clocked element in the synchronous system.

Typically, the clock signal is distributed from the clock source to the elements of a large synchronous system through a clock tree. The clock tree includes buffers that distribute the received clock signal to multiple paths, such that a tree shaped structure is formed with the clock source at the trunk of the tree and the elements of the synchronous system receiving the clock signal at the leaves of the tree. One distributed clock tree technique is an H-tree scheme for distributing the clock signal, as shown in FIG. 6. The illustrated H-tree scheme distributes the clock signal along branches in a tree wherein the leaves in the tree are the clocked elements of the synchronous system. H-tree schemes can be used to distribute the clock signal to regular arrays within a synchronous system such that every element in the synchronous system has the same distance from the clock generator.

Clock tree distribution schemes, however, suffer from drawbacks such as clock skew. Clock skew is defined as the time delay between generation of the clock signal at a clock source and arrival of the clock signal at a selected clocked element. Differences in clock skew between the clock source and different clocked elements can create errors in the synchronous system as the clocked elements are triggered at different points in time.

Accordingly, there is a need for a synchronous system that generates and distributes a clock signal with reduced errors caused by differences in clock skew.

SUMMARY OF THE INVENTION

Errors caused by distributing a clock signal may be reduced, according to the invention, by generating a distributed clock signal from a ring structure coupled to a chain structure. The ring structure is formed of an even number of distributed oscillator elements. These oscillator elements are serially connected together in a ring. The chain structure is formed of an even number of distributed oscillator elements serially connected together. The chain structure is coupled across an odd number of oscillator elements in the ring structure.

In one embodiment of the invention, the ring structure is formed of an even number of inverters serially connected together in a ring. The inverters in the ring structure are connected together so that the output of each inverter is operably coupled to the input of the subsequent inverter in the ring.

The chain structure can be formed of an even number of serially connected inverters. The inverters in the chain structure can be operably coupled across a selected inverter in the ring structure of the clock stabilizer. For instance, the output of the last inverter in the chain structure can be coupled to the input of the selected inverter in the ring structure, and the input of the first inverter in the chain structure can be coupled to the output of the selected inverter in the ring structure.

BRIEF DESCRIPTION OF THE DRAWINGS

The foregoing features and advantages of the invention will be apparent from the following description, as illustrated in the accompanying figures in which like reference characters refer to the same elements throughout the different views.

DETAILED DESCRIPTION

Figure 1:
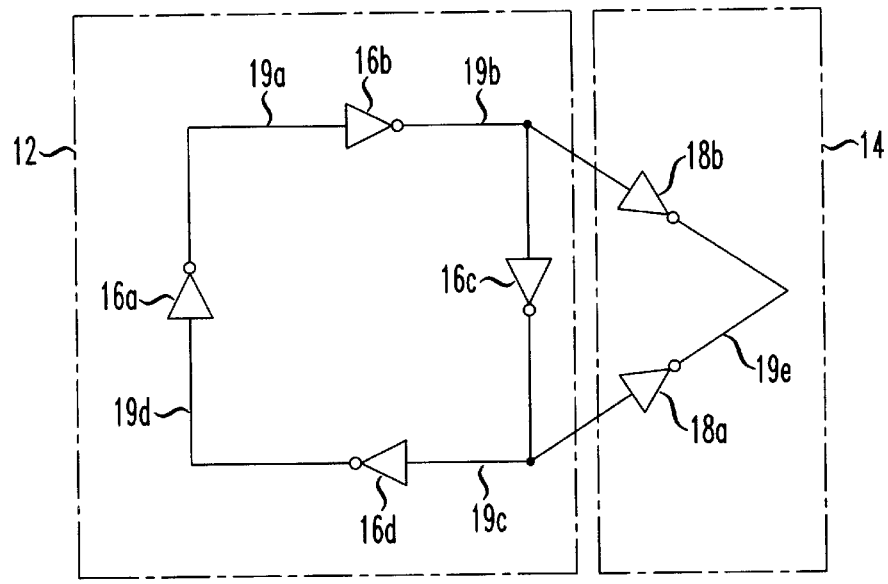
FIG. 1 schematically illustrates a clock generator having a ring structure and a chain structure.

FIG. 1 shows a clock generator 10 for generating a clock signal. The clock generator 10 has a ring structure 12 and a chain structure 14. The ring structure 12 is formed of an even number of distributed oscillator elements 16a, 16b, 16c and 16d. The oscillator elements 16a–16d are serially connected together in a ring. The chain structure 14 is formed of an even number of distributed oscillator elements 18a, 18b serially connected together. The chain structure 14 is coupled across an odd number of oscillator elements in the ring structure 12. The clock signal can be extracted from any of the distributed oscillator elements 16a–16d, 18a and 18b.

Each of the distributed oscillator elements is capable of generating a signal that varies between alternative extremes over a period of time. Examples of the distributed oscillator elements include crystal oscillators and inverters. In operation, the distributed oscillator elements 16a–16d, 18a and 18b each generate a clock signal that varies between high and low voltages over time. The exemplary distributed oscillator elements shown in FIG. 1 are inverters.

As further shown in FIG. 1, the oscillator elements 16a–16d are connected in a ring structure 12. In particular, the ring structure 12 is formed by: connecting the output of inverter 16a to the input of inverter 16b; connecting the output of inverter 16b to the input of inverter 16c; connecting the output of inverter 16c to the input of inverter 16d; and connecting the output of inverter 16d to the input of inveter 16a.

The exemplary chain structure 14, as shown in FIG. 1, is formed of serially connected inverters 18a and 18b. The chain structure is operably coupled across inverter 16c in the ring structure 12. In particular, the input to inverter 18a is connected to the output of inverter 16c, the output of inverter 18a is connected to the input of inverter 18b, and the output of inverter 18b is connected to the input of inverter 16c. This arrangement of inverters in the ring structure 12 and in the chain structure 14 allows the clock signal to be extracted from any of the inverters in the clock generator 10.

FIG. 1 further illustrates electrically conductive paths 19a, 19b, 19c, 19d and 19e for operably coupling the inverters in the clock generator 10. For instance, conductive path 19a connects inverters 16a and 16b together. Conductive path 19b connects inverters 16b, 16c and 18b together. Conductive path 19c connects inverters 16c, 16d and 18a together. Conductive path 19d connects inverters 16a and 16d together; and conductive path 19e connects inverters 18a and 18b together. The conductive paths 19a–19e can be electrical wires or traces on a substrate.

In operation, the inverters 16a–16d and 18a–18b are powered by a power supply (not shown) so that each inverter generates an output signal that is the digital inversion of the input signal thereto. For example, if inverter 16a receives a signal representative of a digital signal "1" then inverter 16a generates a signal representative of the digital signal "0".

The even number of inverters in the chain structure 14 plus the selected inverter in the ring structure 12 across which the chain structure is coupled, forces the inverters in the clock generator 10 to oscillate between digital values "1" and "0". Consider the clock generator circuit illustrated in FIG. 1, wherein the initial conditions are that the output of inverter 18a is "1" and the output of inverter 18b is "0". In the clock generator circuit, the output of inverter 18b is coupled to inverter 16c, and accordingly the output of inverter 16c is forced to digital "1" when the output of 18b is "0". When inverter 16c changes state to "1", then inverter 18a changes state to "0" and inverter 18b changes state to "1". As the cycle continues, the inverters 18a, 18b and 16c clearly oscillate between the digital states of "0" and "1".

Each of the inverters, 16a–16d, contained in the ring structure 12 also oscillate between digital values "0" and "1". As inverter 16c changes state from a digital "0" to a digital "1", the inverters 16d, 16a, and 16b all successively change state in response to the state change of inverter 16c. Thus, the change in state of the inverters 18a, 18b in the chain structure forces all the inverters in the clock generator 10 to change state.

The oscillating digital states of the signal passing along the chain of inverters in the clock generator 10 form a clock signal. The clock signal can be extracted from any of the inverters in the clock generator 10. The frequency of the clock signal remains stable regardless of where the clock signal is extracted. The circuit of the inverters in the clock generator 10 can be extended over the area of an integrated circuit or printed circuit board so that the clock signal is available throughout the integrated circuit or printed circuit board.

The oscillation frequency of the clock generator 10 is based upon the time delay it takes each inverter in the chain structure 14 to change state. Assuming inverters 18a, 18b, and 16c have substantially the same time delay Td before they change state, then the frequency of oscillation of the clock generator=$1/(6*Td)$. Generally speaking, if the inverters have substantially the same time delay, then the clock signal generated by the clock generator 10 resonates at a frequency of: $1/(2*(N+1)*Td)$; wherein N is the number of inverters in the chain structure 14.

Figure 2:
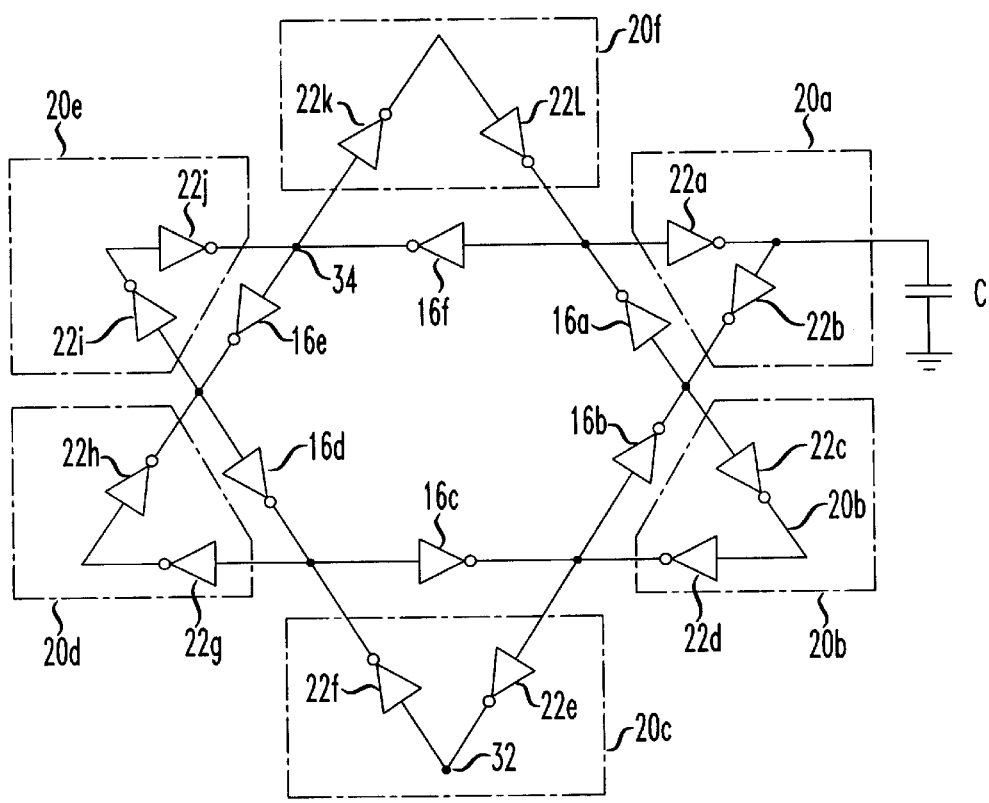
FIG. 2 schematically shows a clock generator mesh formed from a ring structure and a plurality of chain structures.

FIG. 2 illustrates a clock generator mesh 28 formed from a ring structure 12 and from chain structures 20a, 20b, 20c, 20d, 20e and 20f. The internal ring structure includes six inverters 16a–16f serially coupled together, and each of the chain structures 20a–20f include two inverters serially coupled together.

The clock generator mesh 28 includes a ring structure 12 having an even number of serially connected inverters and further includes chain structures associated with each of the inverters in the ring structure 12. Each chain structure must also have an even number of serially connected inverters. The clock generator is not limited to the star shaped mesh schematically shown in FIG. 2. In addition, other aspects of the invention provide for meshes having paths interconnecting the inverters that are not of equal length. For instance, the conductive paths 19a–19e of FIG. 1, do not need to equally space inverters 16a–16b and 18a–18b.

With further reference to FIG. 2, each of the chain structures is operably coupled across an inverter in the internal ring 12. In particular: inverters 22a and 22b are connected across inverter 16a; inverters 22c and 22d are connected across inverter 16b; inverters 22e and 22f are connected across inverter 16c; inverters 22g and 22h are connected across inverter 16d; inverters 22i and 22j are connected across inverter 16e; and inverters 22k and 22l are connected across inverter 16f. The output of the last inverter in each chain structure is coupled to the input of the selected inverter in the internal ring 12, and the input of the first inverter in each chain structure is coupled to the output of the selected inverter in the internal ring 12. For example, the output of the inverter 22b in chain structure 20a is coupled to the input of the inverter 16a in the internal ring 12, and the input of the inverter 22a in the chain structure 20a is coupled to the output of the inverter 16a in the internal ring 12.

In operation, the state changes in the chain structures 20a–20f cause the entire clock generator mesh 28 to oscillate at a particular frequency dependent upon the number of inverters, N, in the chain structures and the time delay, Td, of the inverters in the chain structures. Accordingly, in one aspect of the invention, the clock signal generated by the clock generator mesh 28 oscillates at a frequency of: $1/(2*(N+1)*Td)$.

In another aspect of the invention, the oscillation frequency of the clock generator mesh can be modified by changing the characteristics of the clock generator mesh. For example, a control element can be connected to node 17 of mesh 28, as illustrated in FIG. 2. The control element modifies the oscillation frequency of the clock generator mesh 28 by controlling the time between transitions at the output of the inverter 22b of mesh 28. The control element can be: a circuit for varying the capacitive loading on the output of an inverter; a circuit for varying, i.e. "starving", the power supply current supplied to the inverter; an electronically-controlled variable propagation delay inverter as described in Fernandez et al., U.S. Pat. No. 5,479,129, which is incorporated herein by reference; a logic gate controlled variable delay line as described in Leonowich, U.S. Pat. No. 5,434,525, which is incorporated herein by reference; or a differential variable delay element as described in Sonntag, U.S. Pat. No. 5,012,142, which is incorporated herein by reference.

In either aspect of the invention, the clock signal can be extracted at any point in the clock generator mesh 28. For example, a clock signal extracted from a node 32, located on an outer path of the mesh 28, is substantially equal to a clock signal extracted from a node 34, located on an inner path of the mesh 28.

Figure 3:
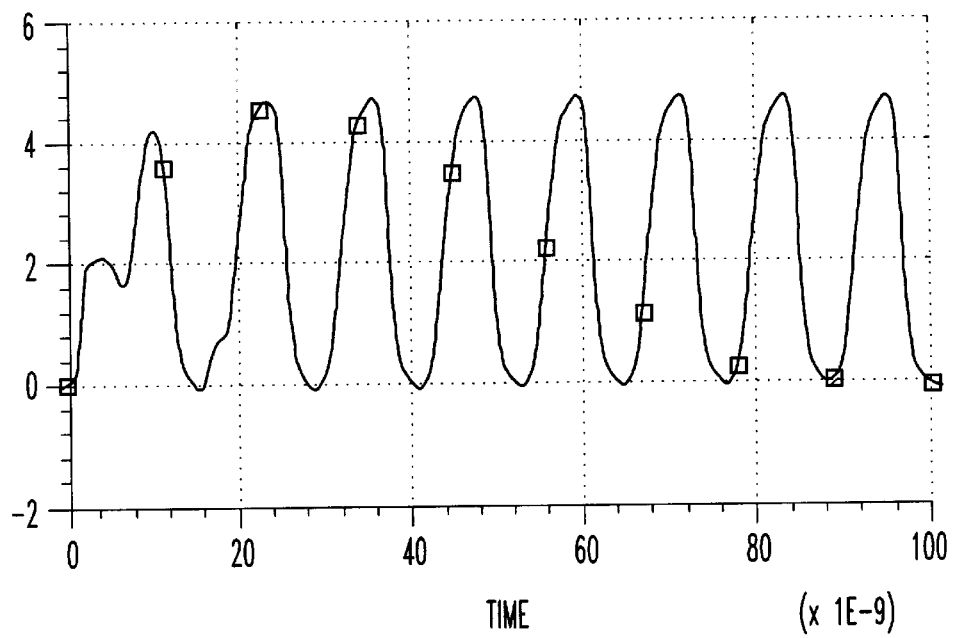
FIGS. 3 and 4 graphically illustrate the frequency at two different nodes found in the clock generator mesh of FIG. 2.
Figure 4:
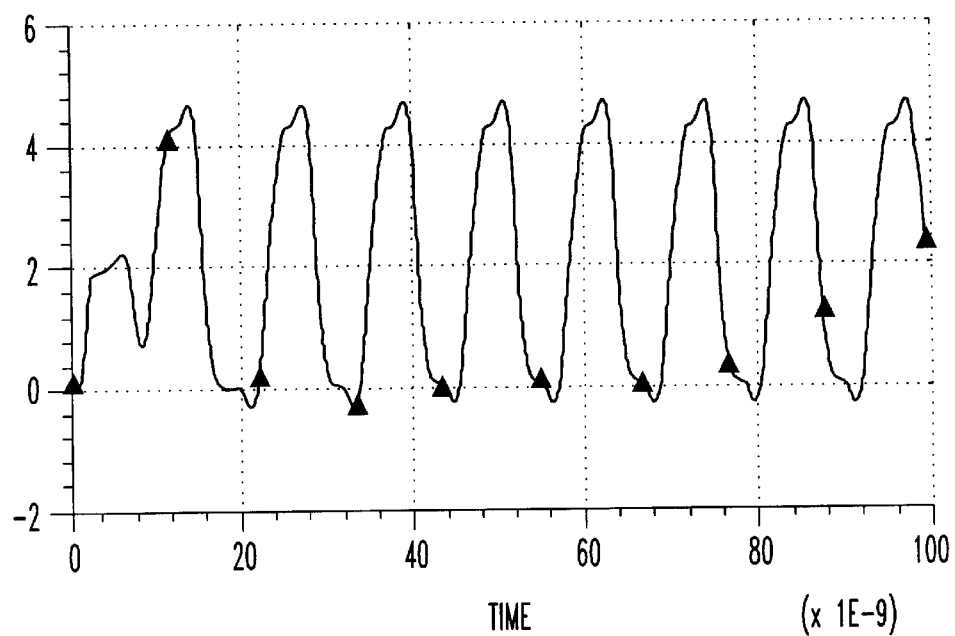

FIGS. 3 and 4 illustrate a graph of voltage verses time for different nodes on the clock generator network 30. The graphs of FIGS. 3 and 4 were generated by simulating the circuit of FIG. 2. FIG. 3 shows the voltage for node 34 of FIG. 2 at different points in time, and FIG. 4 shows the voltage for node 32 of FIG. 2 at different points in time.

The graphs of FIGS. 3 and 4 demonstrate that the clock generator mesh 28 generates a clock signal of the same frequency throughout the mesh 28. The frequency of the signals illustrated in FIGS. 3 and 4 are substantially equal, even though they were extracted from different nodes in mesh 28.

Figure 5:
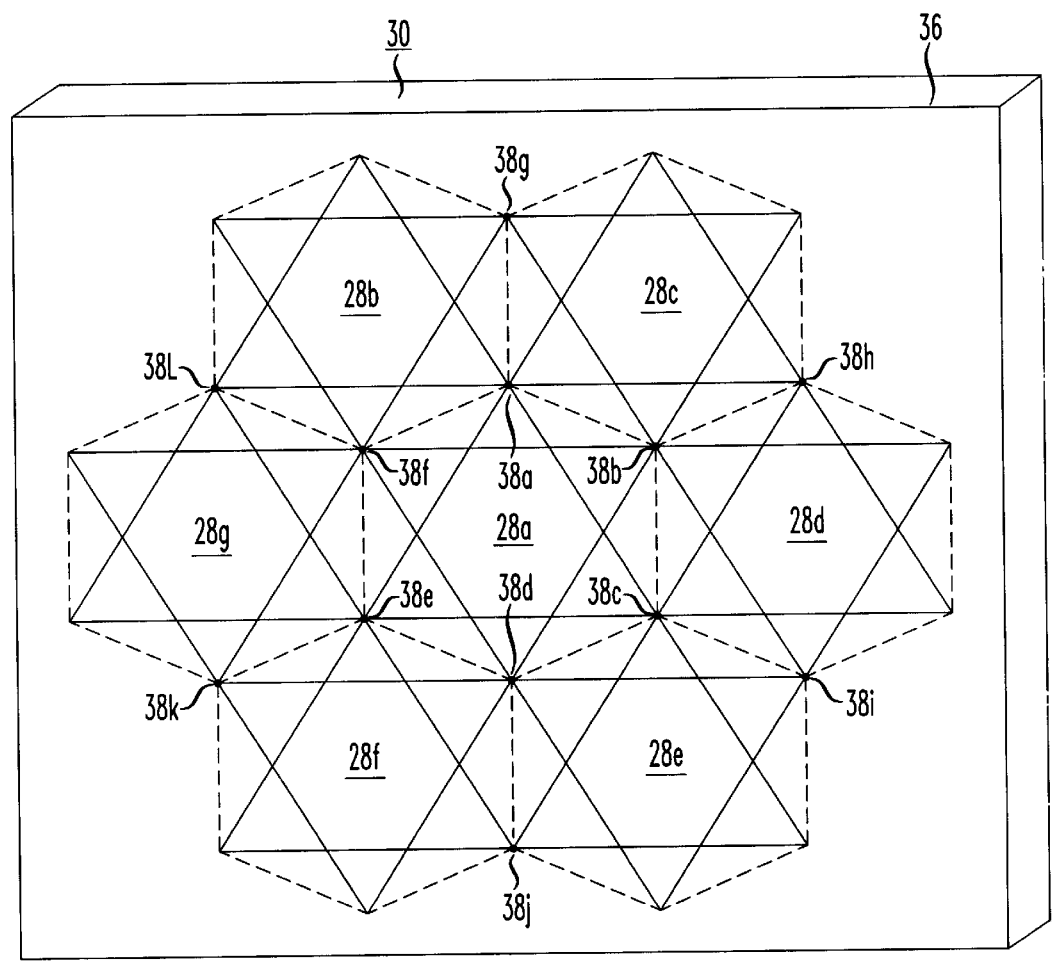
FIG. 5 shows a clock generator network formed from the clock generator mesh of FIG. 2.
Figure 6:
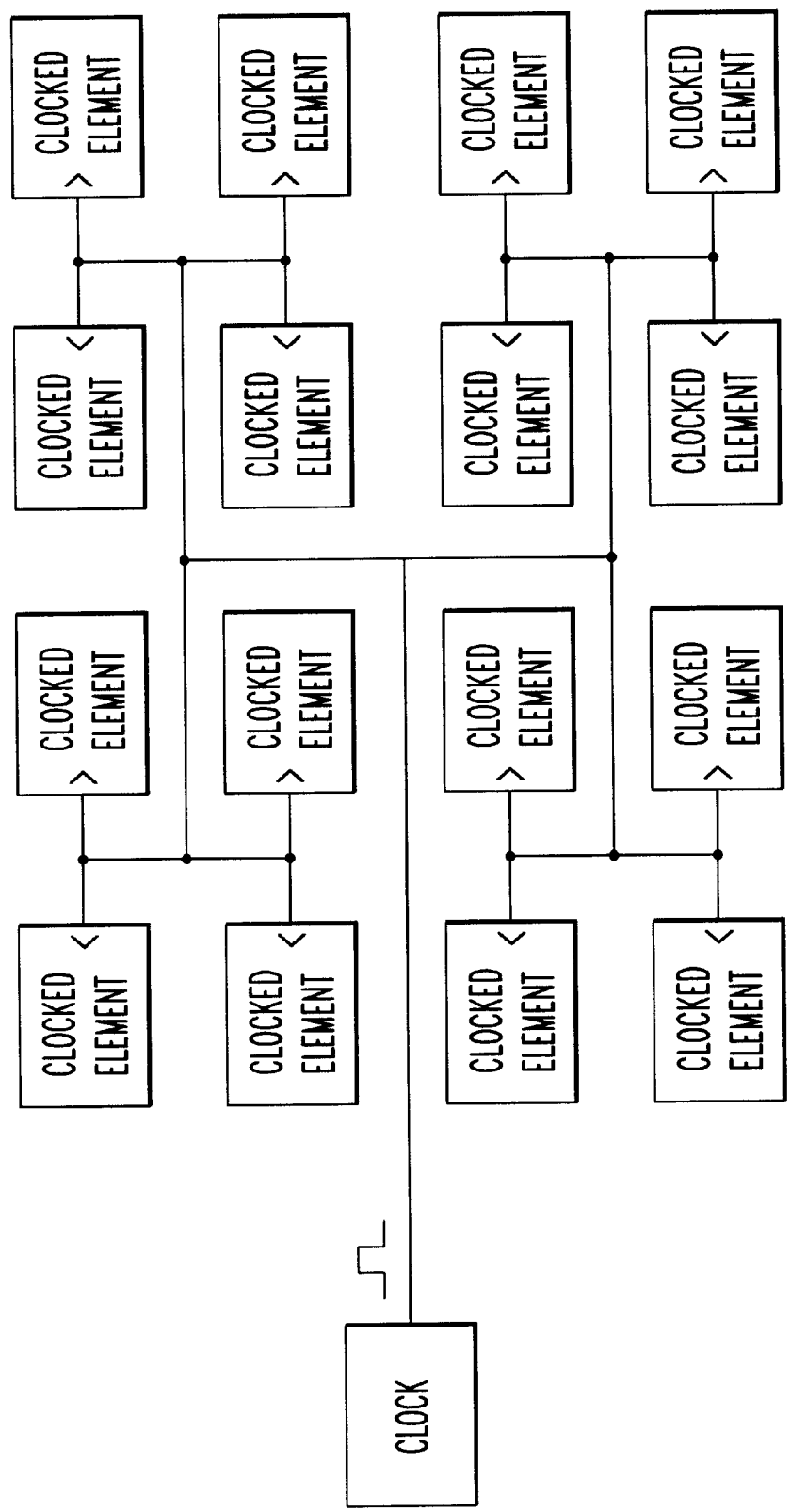
FIG. 6 illustrates a prior art clock tree technique for distributing a clock signal.

FIG. 5 shows a clock generator network 30 formed by duplicating the clock generator mesh 28 of FIG. 2 and by connecting together the duplicated meshes. The clock generator network 30 includes meshes 28a, 28b, 28c, 28d, 28e, 28f and 28g. Each of the meshes 28a–28g is equivalent to mesh 28 of FIG. 2. The meshes 28a–28g are operably coupled together at nodes 38a–38l. Two or more clock generator meshes 28 can be coupled together to form a clock generator network.

Dotted and solid lines further clarify the clock generator meshes forming the network 30. The dotted lines identify imaginary boundaries between the meshes 28a–28g. The dotted lines aid in illustrating how individual meshes are positioned relative to other meshes to form a network. The solid lines indicate the electrically conductive paths in each of the meshes 28a–28g. Each of the electrically conductive paths includes an inverter, as illustrated in FIG. 2.

Additionally, nodes 38a–38l show the interconnection between meshes 28a–28g. At each of the nodes, 38a–38l, the electrically conductive paths of the meshes are interconnected. For instance, meshes 28a, 28b and 28c interconnect at node 38a.

At startup of the network 30, the meshes 28a–28g attempt to oscillate at a particular frequency and phase. The meshes typically operate at substantially the same frequency, however, the phase differences between the meshes 28a–28g may be significant at startup. Each of the meshes attempts to force its phase onto any adjacent meshes. These attempts by each mesh to assert its phase on adjacent meshes cause the interconnected network 30 to oscillate at the lowest energy state. Typically, the lowest energy state for the a clock generator network occurs when the entire network oscillates at one particular frequency and when all the inverters in the network change state in phase with each other. In the case of a mesh 30 that is formed of inverters, the lowest energy state occurs when the entire network oscillates at one particular frequency, when adjacent inverters are 180 degrees out-of-phase, and when every other inverter in the network changes state substantially in-phase. Accordingly, after passing through a short initialization period, the inverters in the clock generator network 30 oscillate at the same frequency, and adjacent inverters are 180 degrees out-of-phase while every other inverter is substantially in-phase.

The clock generator network 30 can be distributed on an integrated circuit chip 36. Preferably, the clock generator network 30 spans the chip 36 in order to provide a clock signal throughout the integrated circuit.

While the invention has been shown and described having reference to specific preferred embodiments, those skilled in the art will recognize that variations in form and detail may be made without departing from the spirit and scope of the invention. Thus, specific details of the disclosure herein are not intended to be necessary limitations on the scope of the invention other than as required by the prior art.

I claim:

1. An apparatus for generating a distributed clock signal, the apparatus comprising:
    a ring structure formed of an even number of distributed oscillator elements serially connected together in a ring, and
    a chain structure operably coupled across each distributed oscillator element in the ring structure, each of the chain structures being formed of an even number of distributed oscillator elements serially connected together, such that a mesh of oscillator elements is formed,
    wherein the clock signal can be extracted from any of the plurality of oscillator elements.

2. The apparatus according to claim 1, wherein the distributed oscillator elements in the chain structure are inverters.

3. The apparatus according to claim 2, wherein the ring structure is formed of an even number of serially connected inverters such that the output of each inverter is operably coupled to the input of the subsequent inverter in the ring, and
    wherein the chain structure is coupled across a selected inverter in the ring structure.

4. The apparatus according to claim 3, wherein the chain structure is formed of N inverters, each inverter having a signal propagation delay of approximately Td, such that the clock signal resonates at a frequency of: $1/(2*(N+1)*Td)$.

5. The apparatus according to claim 3, wherein the ring structure is formed of six inverters and the chain structure is formed of two inverters.

6. The apparatus according to claim 5, wherein a chain of two inverters is connected across each of the six inverters in the ring structure such that a mesh is formed.

7. The apparatus according to claim 1, further comprising a plurality of meshes operably coupled together to form a network.

8. The apparatus according to claim 7, wherein a plurality of meshes are coupled together to form a network of oscillator elements.

9. The apparatus according to claim 1, further comprising a control element connected to a designated oscillator element for modifying the frequency of the clock signal.

10. The apparatus according to claim 1, wherein the clock signal extracted from each oscillator element varies at substantially the same frequency.

11. The apparatus according to claim 1, wherein the distributed oscillator elements in the ring structure are inverters.

12. An apparatus for generating
    a distributed clock signal, the apparatus comprising:
    a ring structure formed of an even number of distributed oscillator elements serially connected together in a ring, and
    a chain structure formed of an even number of distributed oscillator elements serially connected together, the chain structure being coupled across an odd number of oscillator elements in the ring structure,
    wherein the clock signal can be extracted from any of the plurality of oscillator elements and wherein the oscillator elements span the area of an integrated circuit and distribute the clock signal throughout the integrated circuit.

13. An apparatus for generating a distributed clock signal, the apparatus comprising:
    a ring structure formed of an even number of inverters serially connected together in a ring, such that the output of each inverter is operably coupled to the input of the subsequent inverter in the ring, and
    a chain structure operably coupled across each inverter in the ring structure, each of the chain structures being formed of an even number of inverters serially connected together, such that a mesh of inverters is formed, wherein the clock signal can be extracted from any of the plurality of inverters.

14. The apparatus according to claim 13, further comprising a control element connected to a designated inverter for modifying the frequency of the clock signal.

15. The apparatus according to claim 13, wherein the clock signal extracted from each inverter varies at substantially the same frequency.

* * * * *